United States Patent [19]

Ohno

[11] Patent Number: 4,475,007

[45] Date of Patent: Oct. 2, 1984

[54] METHOD OF MOUNTING SEMICONDUCTOR CHIP FOR PRODUCING SEMICONDUCTOR DEVICE AND A CHIP-SUPPORTING MEMBER USED THEREIN

[75] Inventor: Junji Ohno, Hamamatsu, Japan

[73] Assignee: Nippon Gakki Seizo Kabushiki Kaisha, Hamamatsu, Japan

[21] Appl. No.: 281,365

[22] Filed: Jul. 8, 1981

[30] Foreign Application Priority Data

Jul. 14, 1980 [JP] Japan .................. 55-96117

[51] Int. Cl.³ .............................. H05K 5/02
[52] U.S. Cl. .................. 174/52 FP; 29/464; 29/577 R; 357/74
[58] Field of Search .......... 174/52 FP, 52 H; 357/74; 228/180 A; 29/464, 577 R, 590; 156/655, 656, 153, 154

[56] References Cited

U.S. PATENT DOCUMENTS 3,392,052  7/1968  Davis .................. 156/154 X
3,869,787  3/1975  Umbaugh .............. 29/464 X
4,167,413  9/1979  Christ et al. .......... 174/52 FP X Primary Examiner—John Gonzales
Assistant Examiner—D. A. Tone
Attorney, Agent, or Firm—Spensley Horn Jubas & Lubitz

[57] ABSTRACT

A method for mounting a semiconductor chip to a supporting member in producing an integrated circuit, and a semiconductor chip supporting member used in this method, wherein the chip-mounting member having a chip-mounting surface with waved peripheral edge pattern is prepared, and a semiconductor chip is mounted onto this chip-mounting surface via a solder preform, and then the resulting assembly is subjected to a heat treatment to melt this solder. Whereupon, even when the semiconductor chip is placed at an eccentric position deviating from the central position of the mounting surface, it is pulled back toward substantially the required central position by virtue of the surface tension of the molten solder.

20 Claims, 6 Drawing Figures

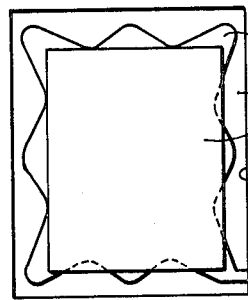
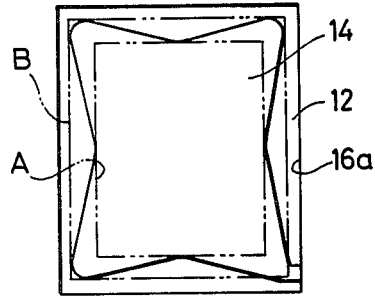
FIG. 4  FIG. 5
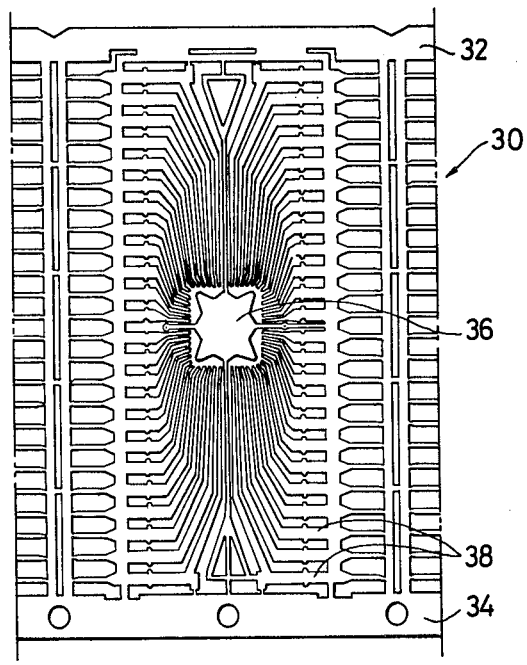
FIG. 6

METHOD OF MOUNTING SEMICONDUCTOR CHIP FOR PRODUCING SEMICONDUCTOR DEVICE AND A CHIP-SUPPORTING MEMBER USED THEREIN

BACKGROUND OF THE INVENTION (a) Field of the Invention

The present invention relates to a method of mounting a semiconductor chip to a supporting member during the production of such a semiconductor device as an integrated circuit. More particularly, it pertains to a method which enables adjustment of the position of the semiconductor chip placed on a soldering preform, by making use of the surface tension of the melted solder which is used for securing the semiconductor chip to the supporting member.

(b) Description of the Prior Art

In the past, the soldering of a semiconductor chip onto a metallized portion within the cavity of a package has relied on the method comprising the steps of: arranging, on a metallized portion provided within the cavity of the package, a preform solder layer made of an eutetic alloy (composition: about 3% of silicon "Si", and the remainder being gold "Au") while the package is being heated on a heat block; placing a semiconductor (Si) chip on said solder layer of eutetic alloy by means of a vacuum pincette or a diecollet; and then scrubbing the semiconductor chip on said preform solder layer to facilitate good attachment of this chip to the eutetic alloy layer and to adjust the position of the semiconductor chip. In view of the fact, however, that this vacuum pincette or the diecollet is made of a hard metal to resist a high temperature, the semiconductor chip which is carried onto the solder preform and then scrubbed thereon by virtue of vacuum suction of the pincette or by being nipped by the diecollet is often subjected to injury or cracking due to the force applied by such sucking or nipping member made of a hard metal to the chip during the course of scrubbing.

Moreover, the eutectic alloy which contains only about 3% of silicon and the remainder gold is expensive due to the large content of gold, and moreover has a high melting point in the range of about 380° to 400° C. Such high temperature employed during the soldering step in the manufacture of a semiconductor device would give an adverse effect to the semiconductor chip, rejectably degrading the quality of the semiconductor device produced.

As an alternative method to eliminate the above-mentioned drawbacks and inconveniences of the prior art, there has been proposed a method which comprises the steps of: placing, via a solder preform, a semiconductor chip on a metallized layer formed within the cavity of a package; and then passing the resulting assembly through a heating furnace to perform soldering of the semiconductor chip to the chip-mounting metallized layer. This latter method is free from development of injury or cracking in the chip. However, in this latter method, the metallized portion within the cavity is formed to have a rectangular shape having an area substantially larger than the chip. Thus, this known method undesirably is entailed by large variance in the position where the chip is fixed in the semiconductor device manufactured, since it is difficult to effectively control the fixing position of the chip.

SUMMARY OF THE INVENTION

A first object of the present invention is to provide a method of mounting a semiconductor chip to a supporting member by soldering, which does not develop injury or cracking of the chip.

A second object of the present invention is to provide a method as described above, which does not develop substantial variance in the position of attachment of the semiconductor chip.

A third object of the present invention is to provide a method as described above, which, even when there arises some deviation in the position of the semi-conductor chip from a predetermined position during the chip-attachment step, this semiconductor chip is moved substantially to the required position by virtue of the surface tension of the melted solder intended for use in the attachment of the chip.

A fourth object of the present invention is to provide a method as described above, which, even in case the semiconductor chip to be attached to a supporting member varies in its size, enables this chip to be attached to substantially the central portion of the chip-mounting surface, so long as said variation of size of the chip is within a predetermined range.

A fifth object of the present invention is to provide a member for supporting a semiconductor chip such that this member has a chip-mounting surface and arranged to develop, in a chip-attaching solder, such surface tension as will facilitate a desired displacement of the semiconductor chip during the step of attaching the chip to the mounting surface.

BRIEF DESCRIPTION OF THE DRAWINGS

FIGS. 3 and 4 are diagrammatic illustrations for explaining displacement of the semiconductor chip to adjust its position.

FIG. 5 is a diagrammatic plan view showing an example of modification of the pattern of the metallized portion intended for the attachment of a semiconductor chip thereonto.

FIG. 6 is a diagrammatic plan view showing lead frames in another embodiment of the present invention.

In the above drawings, FIGS. 1 to 5 are depicted in an enlarged size while FIG. 6 is in substantially actual size of the typical semiconductor device applicable with the present invention.

DETAILED DESCRIPTION OF THE PREFERRED EMBODIMENTS

Figure 1:
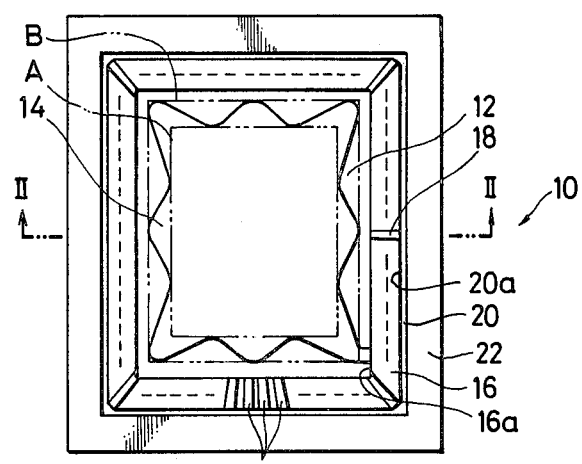
FIG. 1 is a diagrammatic explanatory plan view of a ceramic package for mounting a semiconductor chip, showing an embodiment of the present invention.
Figure 2:
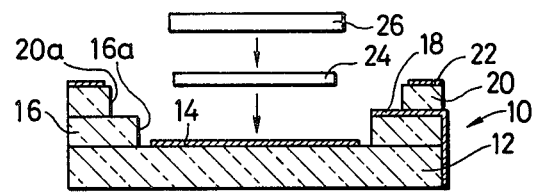
FIG. 2 is a diagrammatic sectional view taken along the line II—II in FIG. 1.

According to the method of the present invention, there is first prepared a laminated-type ceramic package 10 as shown in FIGS. 1 and 2 by relying on known techniques. In this ceramic package 10, a chip-mounting metallic portion 14 is formed on a first ceramic sheet 12 so as to have a wave-like pattern in its outer peripheral edges. In a second ceramic sheet 16 which is laminated on the first ceramic sheet 12, there is provided an aperture 16a of a rectangular shape to expose therethrough the metallic portion 14 formed on the first ceramic sheet 12. Also, on the second ceramic sheet 16, there is laminated a third ceramic sheet 20 via a plurality of metallic layers 18 of strip-like shape intended for the bonding of a plurality of wires. In this third ceramic sheet 20, there is provided a rectangular aperture 20a to expose therethrough a portion (bonding finger portion) of the strip-like metallized layers 18 and also the metallized portion 14. Around said aperture 20a is formed a metallized peripheral layer 22 for the subsequent fixation thereto of a cap member not shown. The apertures 16a and 20a formed in the second and third ceramic sheets 16 and 20 jointly constitute a cavity of the package 10 for accomodating a semiconductor chip therein. The metallic portion 14 is formed, as an example, by using a base layer made of such metal as tungsten, and by plating this base layer of tungsten (W) with nickel (Ni) and then with gold (Au) or silver (Ag) in this order.

Further details of the manner of preparing the respective ceramic sheets and the manner of forming respective metallic or metallized portions are not described here, since they can be performed by relying on known techniques, and since they do not constitute the core of the present invention. Metallic regions, such as the metallic portion 14, formed by metallization, are commonly referred to as "metallized" layers or regions, hence the term "metallized" is used alternatively with the term "metallic" in this specification.

Figure 3:
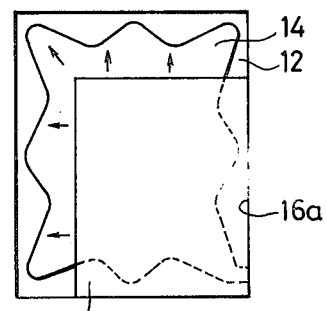

Next, on the metallic portion 14 formed within the cavity of the package 10, there are temporarily located a solder preform 24 and, on this preform 24, a semiconductor chip 26, in this order, as shown in FIG. 2. An example of the manner of such temporary location is shown in FIG. 3. In this instance, the semiconductor chip 26 is often placed eccentrically relative to the center of the metallic portion 14. That side of the semiconductor chip 26 which is to be soldered has preliminarily been provided with an appropriate thin metal film such as Au, Ag, Ti and/or Ni. A solder preform is a piece of solder formed in a suitable shape by, for example, punching a solder sheet. The solder preform 24 used in the invention has a melting point in the range from 380° C. to 150° C. and 270° C. is a practical example. The composition of the solder preform, i.e. ratio of lead, tin and other additives, if used, is determined based on the selected melting point and the kind of metallic substance covering the chip mounting portion 14.

Then, the resulting assembly thus obtained is subjected to a heat treatment by, for example, introducing the assembly into a heating furnace filled with a hydrogen atmosphere, to melt the soldering preform 24 which till then has been mounted on the metallized portion 14 in such state as described above. As a result, the preform 24 of solder melts on the metallized layer 14, and in its molten state, the surface tension of this melt will act on the entire area of the metallized layer 14 in such manner as will pull the semiconductor chip 26 back toward the center of this chip-mounting metallized portion 14. More specifically, as will be noted from FIG. 3, the surface tension of the melt solder acting on the semiconductor chip 26 is greater on the left side and the upper side edges (as viewed in FIG. 3) of the chip 26 rather than at their opposite sides. By virtue of a force corresponding to the difference between the above-mentioned different tensions at the side edges of the chip 26, the semiconductor chip 26 is moved toward the upper left side of the rectangular shape in the drawing, and the movement of this chip 26 ceases when it is brought to substantially the central portion of the metallized portion 14 wherein the respective components of surface tension at the respective opposing side edges of the chip 26 are balanced. It should be noted here that, in FIGS. 3 and 4, the sizes of both the metallized portion 14 and the semiconductor chip 26 are shown in enlarged sizes, and that the relative positions of these two members indicate the typical example wherein the degree of the positional adjustment of the chip 26 was the greatest among many experiments conducted by the inventor.

Thereafter, the molten solder is solidified. Whereupon, the semiconductor chip 26 is fixed firmly to the metallized portion 14.

The position adjustment step of the semiconductor chip 26 from the position shown in FIG. 3 to the position shown in FIG. 4 is effectively carried out so long as the size of the chip is in the range from the one-dot-chain line A to the one-dot-chain line B shown in FIG. 1. Therefore, even when there are variances in the size of the chip within the range of size between A and B, the chip can be fixed to substantially the central portion of the chip-mounting metallized portion 14.

Referring now to FIG. 1 again, symbol A represents a rectangular pattern which inscribes the peripheral edges of the metallized portion 14, whereas symbol B represents a rectangular pattern which circumscribes the peripheral edges of the metallized portion 14. In case the size of the semiconductor chip 26 is smaller than the rectangular pattern A, the surface tension of the molten solder will be rendered equilibrium at all of the four side edges of the chip 26, and thus such distribution of the surface tension of the molten solder will not act effectively on the respective side edges of the chip to pull back the eccentrically located chip toward the central portion of the chip-mounting metallized portion 14. Also, in case the size of the chip 26 is greater than the rectangular pattern B, the chip is soft-soldered only locally at its under side which is to be mounted, and thus the eccentrically positioned chip is not pulled back toward the central portion of the chip-mounting metallized portion 14. It should be noted here that the wave-like peripheral pattern of the chip-mounting metallized portion 14 need not to be such pattern as shown in FIG. 1 wherein each side of the rectangular shape contains two waveshapes. Alternatively, the peripheral edges of the chip-mounting portion may be such that each side has three or more waveshapes. Or further, the pattern may be such as shown in FIG. 5 wherein each side has only one waveshape. For the sake of simplicity, those parts in FIG. 5 which are similar to those in FIG. 1 are indicated by like reference numerals and symbols.

FIG. 6 shows another embodiment of the present invention wherein the present invention is applied to lead frames of a plastic-molded type package. A lead frame generally indicated at 30 is formed by punching-processing an appropriate metal plate to provide, between the frame portions 32 and 34, a chip-mounting portion (die stage) 36 and a number of leads 38 surrounding this chip-mounting portion 36. In this instance, the chip-mounting portion 36 is formed so as to have a waved peripheral pattern as in the instance of the package of the preceding embodiment. Accordingly, in case a semiconductor chip is mounted, via a solder preform layer, onto such chip-mounting portion 36 and then it is melted in a same manner as described in connection with the preceding embodiment, the semiconductor chip, even when it is placed eccentrically relative to the chip-mounting portion, the position of the chip will be corrected automatically so as to be placed at the central portion of the chip-mounting portion 36 by virtue of the surface tension of the molten solder, as in the preceding embodiment. After the foregoing operation, the numerous electrodes provided on the semiconductor chip are wire-bonded to their corresponding leads 38. After this, the resulting assembly is subjected to a package-encapsulating operation by relying on plastic-molding technique.

It should be understood that the waveshape pattern of the peripheral edges of the chip-mounting portion is not limited to those triangular waveshapes as mentioned above, but, instead, circular waveshape, rectangular waveshape and any other appropriate patterns may be equally effectively used.

As described above, according to the present invention, the scrubbing of a semiconductor chip is unnecessary, so that the risk of injuring or cracking the semiconductor chip during the soldering step can be eliminated. Moreover, the solder preform is thin and the content of gold is trifle, so that the manufacture of semiconductor devices can be attained with low cost. Thus, the method of the present invention has many advantages in addition to the automatic positional adjustment of the semiconductor chip.

What is claimed is:

1. A method of mounting a semiconductor chip to a supporting member in the production of a semiconductor device, comprising the steps of:
   preparing a chip-mounting member having a metallic chip-mounting surface with a peripheral edge which is formed in a tapered waved pattern;
   mounting a solder piece onto said chip-mounting surface;
   mounting said semiconductor chip onto said solder piece;
   said semiconductor chip having a size in a range from a figure inscribing the waved edge pattern of said chip-mounting surface to a figure circumscribing said waved edge pattern;
   subjecting the chip-carrying solder piece to a heat treatment to melt said solder piece to allow said semiconductor chip to be moved by surface tension of the molten solder on said waved pattern peripheral edge chip-mounting surface;
   solidifying said molten solder to fix said semiconductor chip onto said chip-mounting surface;
   use of said waved pattern peripheral edge chip mounting surface thereby facilitating the self-aligned mounting of a chip having any selected size within said range.

2. A method according to claim 1, wherein said solder piece has a melting point in the range from 380° C. to 150° C.

3. A method according to claim 2, wherein said solder piece has a melting point of 270° C.

4. A method according to claim 1, wherein said chip-mounting surface has a rectangular shape and said waved peripheral edge pattern of the rectangular chip-mounting surface is symmetrical in respective opposing sides of the rectangular shape.

5. A method according to claim 4, wherein each of a pair of opposing side edges of the rectangular shape of the chip-mounting surface has a formation of at least one waved edge pattern, and each of another pair of opposing side edges of the chip-mounting surface has a formation of at least one waved edge pattern.

6. A method according to claim 1, wherein said waved peripheral edge pattern of the chip-mounting surface is a triangular wave pattern.

7. A method according to claim 1, wherein the semiconductor chip supporting member is a ceramic package for a semiconductor device.

8. A method according to claim 7, wherein said ceramic package is provided with a metallized portion to serve as the semiconductor chip-mounting surface.

9. A method according to claim 8, wherein said metallized portion is formed by a base layer of tungsten plated with nickel and then with gold in this order.

10. A method according to claim 1, wherein the semiconductor chip supporting member is a lead frame of a plastic-molded type package.

11. A method according to claim 1, wherein said semiconductor chip has, on that side thereof which is brought into contact with said solder piece, a metal film formed preliminarily.

12. A method according to claim 11, wherein said metal film is made of a metal selected from the group consisting of gold, silver, titanium and nickel.

13. A semiconductor chip supporting member, comprising:
   a semiconductor chip mounting region on a surface of said member, said surface region being metallic, said metallic surface region having a substantially continuous central portion with peripheral edges of tapered waved pattern.

14. A semiconductor chip supporting member according to claim 13, wherein said chip-supporting member is a ceramic package for an integrated circuit.

15. A semiconductor chip supporting member according to claim 13, wherein said metallic chip mounting region is formed by a base layer of tungsten placed with nickel and then with gold in this order.

16. A semiconductor chip supporting member according to claim 13, wherein said semiconductor chip supporting member is a lead frame of a plastic-molded type package.

17. A semiconductor chip supporting member according to claim 13, wherein the chip-mounting surface is of a rectangular shape.

18. A semiconductor chip supporting member according to claim 17, wherein said waved pattern of the chip-mounting surface is symmetrical on respective two opposing side edges of the rectangular shape.

19. A semiconductor chip supporting member according to claim 13, wherein said wave pattern is a triangular wave pattern.

20. A subassembly component adapted for the self-aligning mounting thereon of an integrated circuit chip having a range of sizes, characterized in that:
   said component has a metallic layer, said layer having a symmetric undulate border in a tapered waved pattern and a substantially continuous central portion, said chip having a size within the range having as a minimum the size of said central portion and as a maximum the size of a figure circumscribing said undulate border, the surface tension effect of a reflowed material situated between said chip and said layer causing self-alignment of said chip regardless of the chip size within said range.

* * * * *